(12) United States Patent
Kuroda et al.

(10) Patent No.: US 6,333,588 B1
(45) Date of Patent: Dec. 25, 2001

(54) PIEZOELECTRIC TRANSFORMER-ACCOMMODATING CASE, A BASE CONNECTOR AND A SOCKET CONNECTOR FOR CONNECTING WIRES TO THE CASE

(75) Inventors: Keiji Kuroda, Amagasaki; Isao Kodani, Toyonaka, both of (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/498,354

(22) Filed: Feb. 4, 2000

(30) Foreign Application Priority Data

Feb. 5, 1999 (JP) ................................. 11-028796

(51) Int. Cl.[7] ................................. H01L 41/08
(52) U.S. Cl. ........................... 310/348; 439/500
(58) Field of Search ............................ 310/348; 439/500, 439/71, 620

(56) References Cited

U.S. PATENT DOCUMENTS

| | | | |
|---|---|---|---|
| 5,847,491 | * 12/1998 | Taihaku et al. | 310/355 |
| 6,057,633 | * 5/2000 | Inoi et al. | 310/345 |
| 6,077,091 | * 6/2000 | McKenna-Olson et al. | 439/71 |
| 6,147,439 | * 11/2000 | Takagi et al. | 310/365 |

* cited by examiner

Primary Examiner—Brian Sircus
Assistant Examiner—Michael C. Zarroli
(74) Attorney, Agent, or Firm—Antonelli, Terry, Stout & Kraus, LLP

(57) ABSTRACT

A piezoelectric transformer-accommodating case (1) is an insulated flat and rectangular box having two input terminals (3) and two output terminals (4) for connection with input electrodes and output electrodes of the transformer (45). The input terminals are respectively at transverse opposite end walls of the case (1), and a lead (21) connecting the input terminals to each other is held in a groove (11) that is longitudinally formed in the case and along its lateral wall so as not to contact any wall of the groove. Support lugs (12) are formed integral with a rim surrounding the opening of the case and shaped such as to bear against a circuit board (46) in a manner that the case set in place is lifted out of the board. An engagement protrusion (13) and a guide protrusion (14) are formed integral with the transverse end wall and fitted in a base connector (30) that thus mates with the case and connects wires to the case. A socket connector (50) is fitted on the base connector so as to connect two wires (47, 48) to terminals of a back-light. The case of this structure matches the recent smaller-sized and thinned back-light inverter circuit employing said transformer for the liquid crystal display, and also improves high-voltage resisting property by virtue of increased linear and spatial distances.

5 Claims, 9 Drawing Sheets

PIEZOELECTRIC TRANSFORMER-ACCOMMODATING CASE, A BASE CONNECTOR AND A SOCKET CONNECTOR FOR CONNECTING WIRES TO THE CASE

BACKGROUND OF THE INVENTION

1. Field of the Invention

The present invention relates on one hand to a piezoelectric transformer-accommodating case for use to hold therein the transformer as one of devices constituting a power supply inverter circuit, wherein this circuit will activate the back-light device for a liquid crystal plate-shaped display, and on the other hand relates also to a base connector mating with the piezoelectric transformer-accommodating case and a socket connector for bringing wires into electric communication with the case.

2 Prior Art

Piezoelectric transformers are considerably narrow in width as compared with the conventional coil type transformers. Such piezoelectric transformers are advantageous to reduce size and thickness of the power supply circuits in which they may be incorporated to build the back-light devices for liquid crystal panels. Notebook type personal computers have recently been required not only to be highly efficient but also thinner and more compact in configuration. Therefore, those piezoelectric transformers are nowadays employed sometimes in their back-light inverter devices for liquid crystal panels. The Japanese Patent Laying-Open Gazette No. 9-260737, for instance, discloses a protective case for piezoelectric transformer, wherein the case is of such a design that the area width for surface mount of the transformer will be decreased.

SUMMARY OF THE INVENTION

An object of the present invention is to provide a piezoelectric transformer-accommodating case as well as a base connector and a socket connector, with these connectors being adapted to adjoin the case so as to connect wires thereto, and the case and the connectors are sophisticated in the following fashion. In detail, the case and connectors have to be of such a structure that a back-light inverter with the transformer activating liquid crystal panels will be made thinner and more compact. Further, a sufficient linear distance and a sufficient spatial distance will nevertheless be afforded between a pair of positive and negative electric members such as electrodes or contacts to thereby enhance high-voltage resisting property of the case and the connectors. The linear distance is defined herein as a distance measured along surfaces intervening between the pair of those electric members that are incorporated herein in combination.

In order to achieve this object, a piezoelectric transformer-accommodating case provided herein and made of an insulating material is of a flat and rectangular box-like shape. This case has input terminals and output terminals that are for connection with two input electrodes and two output electrodes of the piezoelectric transformer, respectively. The two input terminals are disposed respectively at opposite end walls of the case and arranged fore and aft longitudinally thereof. The case has an opening defined between the opposite end walls and elongate lateral walls, and comprises a lead electrically communicating with the two input terminals and held in a groove that is longitudinally formed in the case and along one of the lateral walls thereof. The lead is isolated within the groove so as not to be in contact with wall surfaces thereof. A plurality of support lugs formed integral with a rim surrounding the opening, the support lugs being of such a shape as to bear against a circuit board in a manner that the case set in place will be lifted out of the circuit board. The case further comprises an adapter secured to one of the opposite end walls of the case so as to mate with a base connector for connecting two wires to the case.

The base connector for connecting the two wires to the piezoelectric transformer-accommodating case comprises an insulated housing, an input pin contact and an output pin contact that are arranged in parallel with each other in the insulated housing. The pin contacts are respectively disposed in part in discrete compartments that are separated one from another with a partition formed in the insulated housing. The input pin contact is for electric connection with the input terminal, with the output pin contact being for electric connection with the output terminal. Preferably, the input pin contact may be inserted through one of the opposite end walls so as to electrically communicate with the input terminal. The output pin contact may have a rearwardly extending lead that is bent sideways and outwards to be soldered to the circuit board so that a circuit pattern thereon brings the output terminal into an electric communication with the output pin contact.

A socket connector also provided herein to be coupled with the base connector so as to bring the two wires into electric communication with the respective pin contacts. The socket connector may comprise a bifurcated and insulated housing, and a pair of cylindrical chambers constituting the bifurcated and insulated housing. The socket connector further comprises socket contacts securing therein ends of the wires and lying in respective cylindrical chamber in such a state that said socket contact isolated from each other. One of the socket contacts is designed to mate with the input pin contact, and one of the cylindrical chamber accommodating the one socket contact is made longer than the other cylindrical chamber in which the other socket contact is secured. This feature will afford linear and spatial distances increased enough to enhance high-voltage resisting property of the socket connector. The socket connector may further comprise lances for latching the socket contacts and causing each of them to lie on its side, wherein these lances may be disposed along the sidewalls of the cylindrical chambers.

THE PREFERRED EMBODIMENTS

Figure 1:
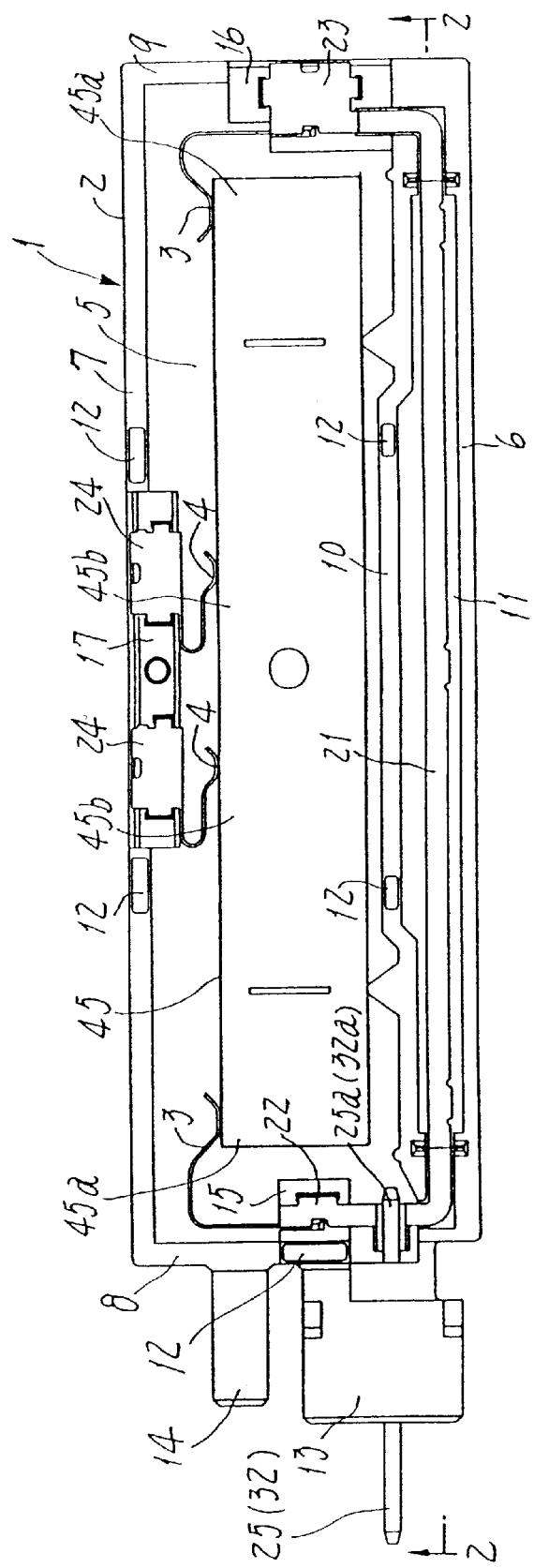
FIG. 1 is a plan view of a piezoelectric transformer-accommodating case provided in accordance with the present invention.

Some preferable embodiments of the present invention will now be described referring to the drawings. The reference numeral 1 in FIGS. 1 to 3 denotes a piezoelectric transformer-accommodating case which the present invention provides. This case 1 substantially consists of a case body 2 made of an insulating material such as a modified '6T' type Nylon (a registered trademark), two input terminals 3 and two output terminals 4. The case body 2, in which all the terminals are secured, is of a flat and rectangular box-like shape, has an upward opening defined by and between a bottom 5 and lateral and end walls 6 to 9 extending along and around the bottom. A piezoelectric transformer 45 will be placed in the case body 2, before the latter is reversed to cause its opening to be stopped with a circuit board 46 (see FIG. 11) and is surface mounted thereon. A partition 10 is formed in the case body 2 and along one of the lateral walls 6 so that a groove 11 is provided between this wall 6 and the partition. This groove 11 receives therein a lead 21 that electrically connects the input terminals 3 to each other (as will be detailed below). A plurality of support lugs 12 protrude from the tops of the other lateral wall 7, one of the opposite end walls 8 (disposed fore and aft longitudinally of the case) and the partition 10. Those lugs 12 will bear against circuit board 46 when the case body 2 to be surface mounted on this circuit board is put upside down thereon to close the opening. In this state, the case body 2 takes a position lifted a small distance above the circuit board 46 so that a sufficient linear distance as well as a sufficient spatial distance are ensured between each of the input terminals 3 and the corresponding output terminal 4. An adapter consisting of an engagement protrusion 13 and a guide protrusion 14 is formed integral with the one end wall 8. This adapter is for connection with a base connector 30 designed to connect wires to the case, as described in detail hereinafter.

Figure 2:
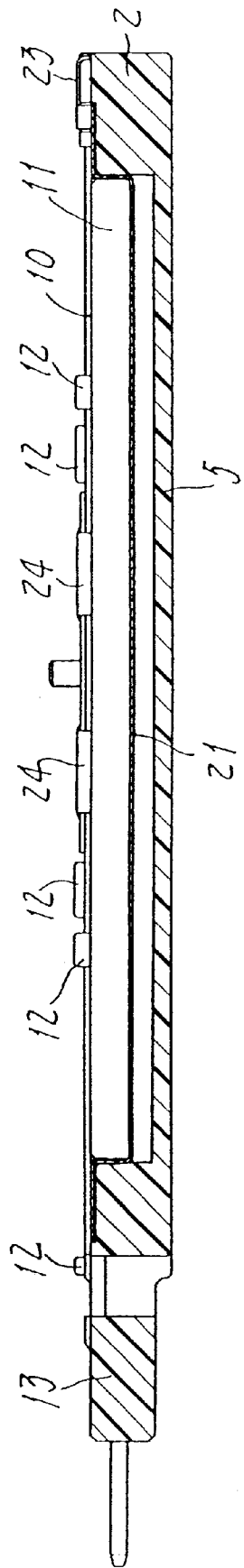
FIG. 2 is a cross section taken along the line 2—2 in FIG. 1.
Figure 3:
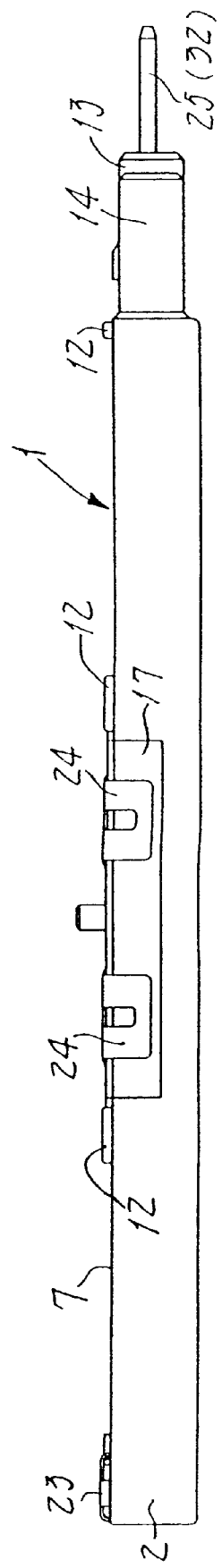
FIG. 3 is a side elevation of the case.
Figure 4:
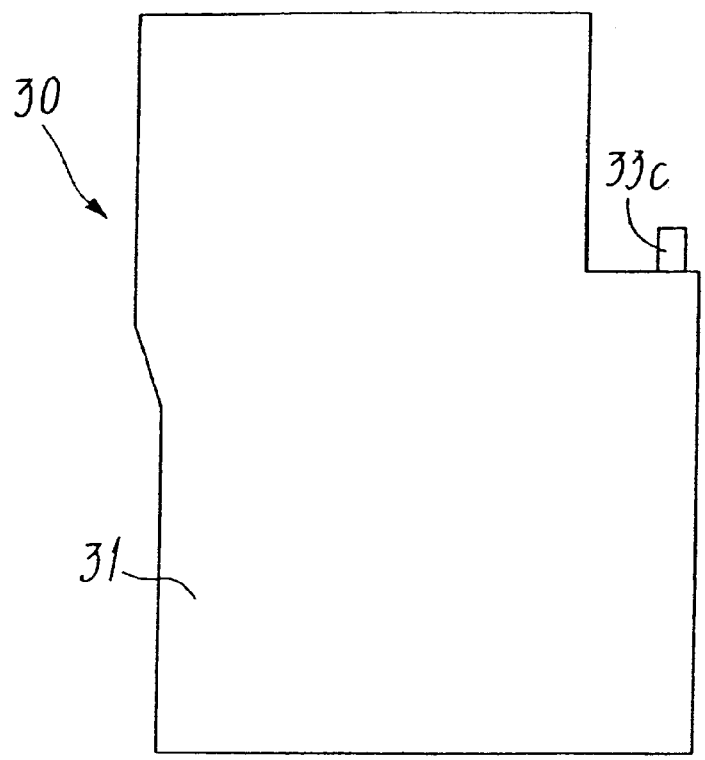
FIG. 4 is a plan view of a base connector provided herein to connect wires to the case.
Figure 5:
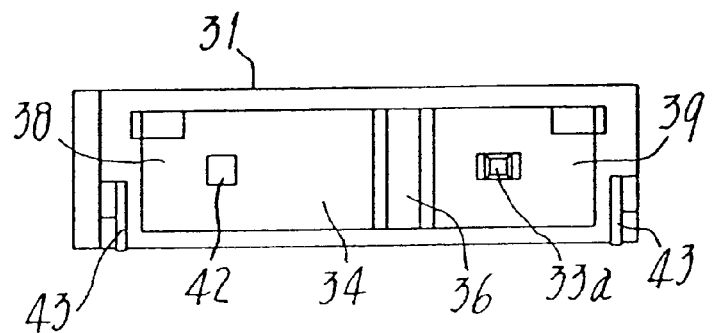
FIG. 5 is a front elevation of the base connector.
Figure 6:
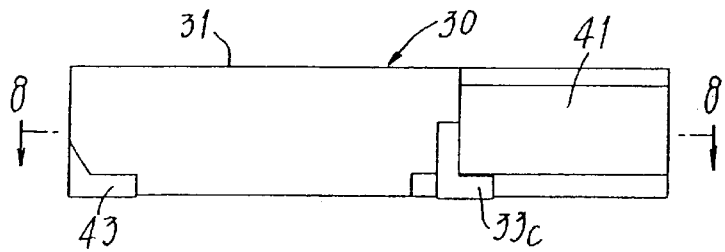
FIG. 6 is a right side elevation of the base connector.
Figure 7:
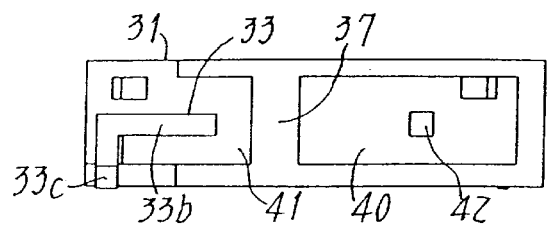
FIG. 7 is a rear elevation of the base connector.

The input terminals 3 and output terminals 4 may be manufactured by punching holes in a conductive metal sheet such as a thin copper alloy sheet to give raw pieces, and then bending them. Inner or fixed ends of the two input terminals 3 are conductively secured to opposite ends of the narrow tape-shaped lead 21 fitting in the groove 11. One of the lead's opposite ends is formed as a fixing portion 22 disposed in contact with the inner end of the one input terminal 3. This portion 22 engages with a support block 15 protruding inwards from the end wall 8, thereby being fixed in position relative thereto. The other lead's end is formed as a solderable portion 23 disposed in contact with the inner end of the other input terminal 3. This portion 23 engages with a bulged portion 16 of the other end wall 9, so as to be fixed therein. As seen in FIGS. 1 and 2, the lead 21 has its major region held in the groove 11 and spaced a distance from the top of case body and also from each neighboring surface. Thus, sufficient linear and spatial distances will be ensured between the lead 21 and the circuit board 46 on which the case is surface mounted. Each output terminal 4 takes a position close to the inner face of a middle region of the other lateral wall 7, and has at its outer end a solderable portion 24 fixedly engaging with a bulged portion 17 of this wall 7.

A conductive post 25 penetrating the engagement protrusion 13 longitudinally of the case body 2 does serve as an input pin contact 32 of the base connector as discussed below. An inner end 25a of the post 25 penetrates the end wall 8 is soldered to the lead conductively continuing to the input terminals 3.

Figure 8:
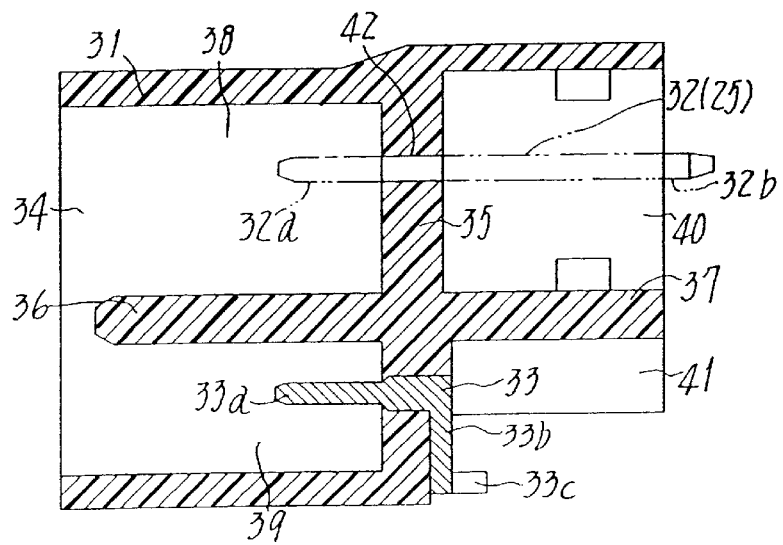
FIG. 8 is a cross section taken along the line 8—8 in FIG. 6.

The base connector 30 shown in FIGS. 4 to 8 comprises an insulated housing 31 molded to be of a depressed cylinder shape. As best seen in FIG. 8, an outer end 32a of the input pin contact 32 set in this housing lies therein in parallel with an outer end 33a of an output pin contact 33. The insulated housing 31 has a front opening 34 and a back wall 35, with a partition 36 extending from the middle portion thereof towards the front opening 34. A rear extension 37 protrudes rearwards from the middle portion of the back wall. The partition 36 defines discrete compartments 38 and 39 that accommodate the outer ends 32a and 33a, respectively. Formed on one side of the rear extension 37 is a recess 40 fitting on the engagement protrusion 13 of the case 1, and formed on the other side is a groove 41 in which the guide protrusion 14 will fit.

As noted above, the input pin contact 32 consists of the conductive post 25 penetrating the engagement protrusion 13 of the case body 2. Therefore, an aperture 42 opened into the recess 40 is formed through the back wall 35 of the insulated housing 31 so as to receive the post 25. With the recess 40 being fitted on the protrusion 13, the post 25 will extend through the aperture 42 so as to serve as the input pin contact 32 so that the outer end 32a thereof is disposed in one of the compartments 38.

The output pin contact 33 is fixed through a portion of the back wall 35, with this portion being generally aligned with the groove 41 whereby the outer ends 33a and 32a lie in parallel but isolated with the partition 36 from each other. An inner end 33b of the output pin contact is bent sideways along the inner surface of the back wall 35, and an extremity of the inner end 33b is further bent downwards and rectangularly to provide an L-shaped solderable portion 33c to be soldered to the circuit board 46. Reinforcement metal pieces 43, which will be soldered to the circuit board, are embedded in the insulated housing 31 on lateral sides thereof opposing each other across the front opening 34.

As will now be apparent, the input pin contact 32 is separated and spaced from the output pin contact 33 by the back wall 35, partition 36 and rear extension 37. By virtue of this feature, linear and spatial distances are increased enough to prevent high-voltage troubles even if the housing 31 is made small in size and the outer ends 32a and 33a of the pin contacts are arranged closer to each other so as to miniaturize the base connector 30 in its entirety.

It may be possible to fix the pin contact 32 through the back wall 35 of the insulated housing 31, similarly to the other pin contact 33. In this alternative case, the inner end 32b protruding rearwards from the back wall 35 will be inserted in a further aperture (not shown) formed through the engagement protrusion 13 of the case body 2, and said end will be brought into electric communication with the lead 21 for the input terminal 3.

Figure 9:
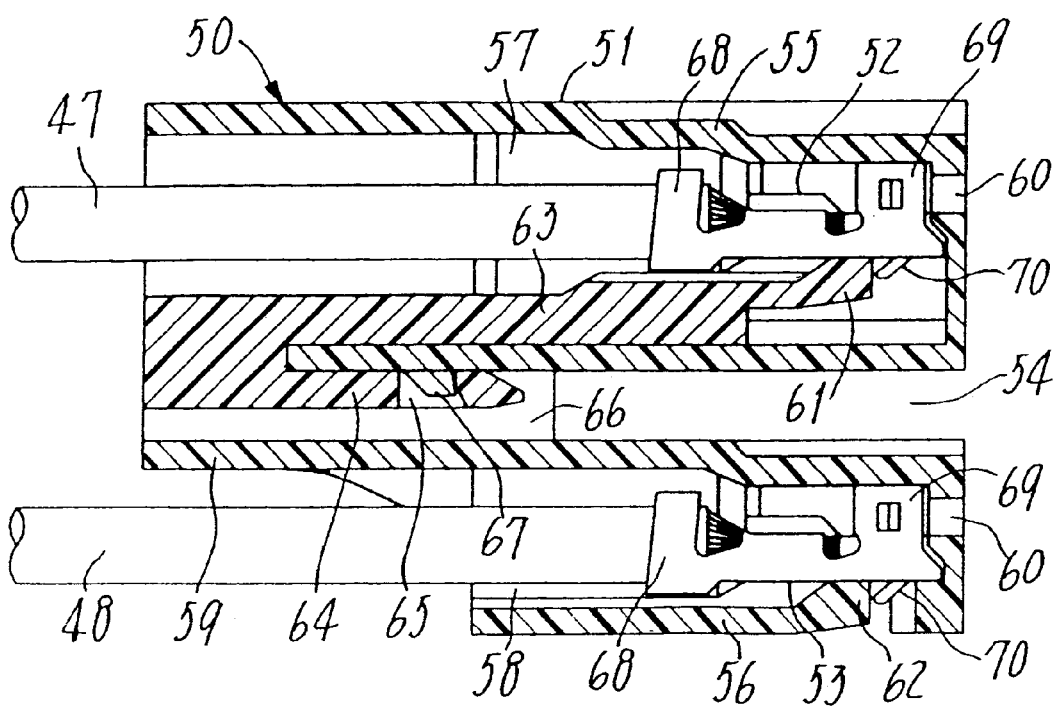
FIG. 9 is a plan view of a socket connector provided herein and shown partly in horizontal cross.
Figure 10:
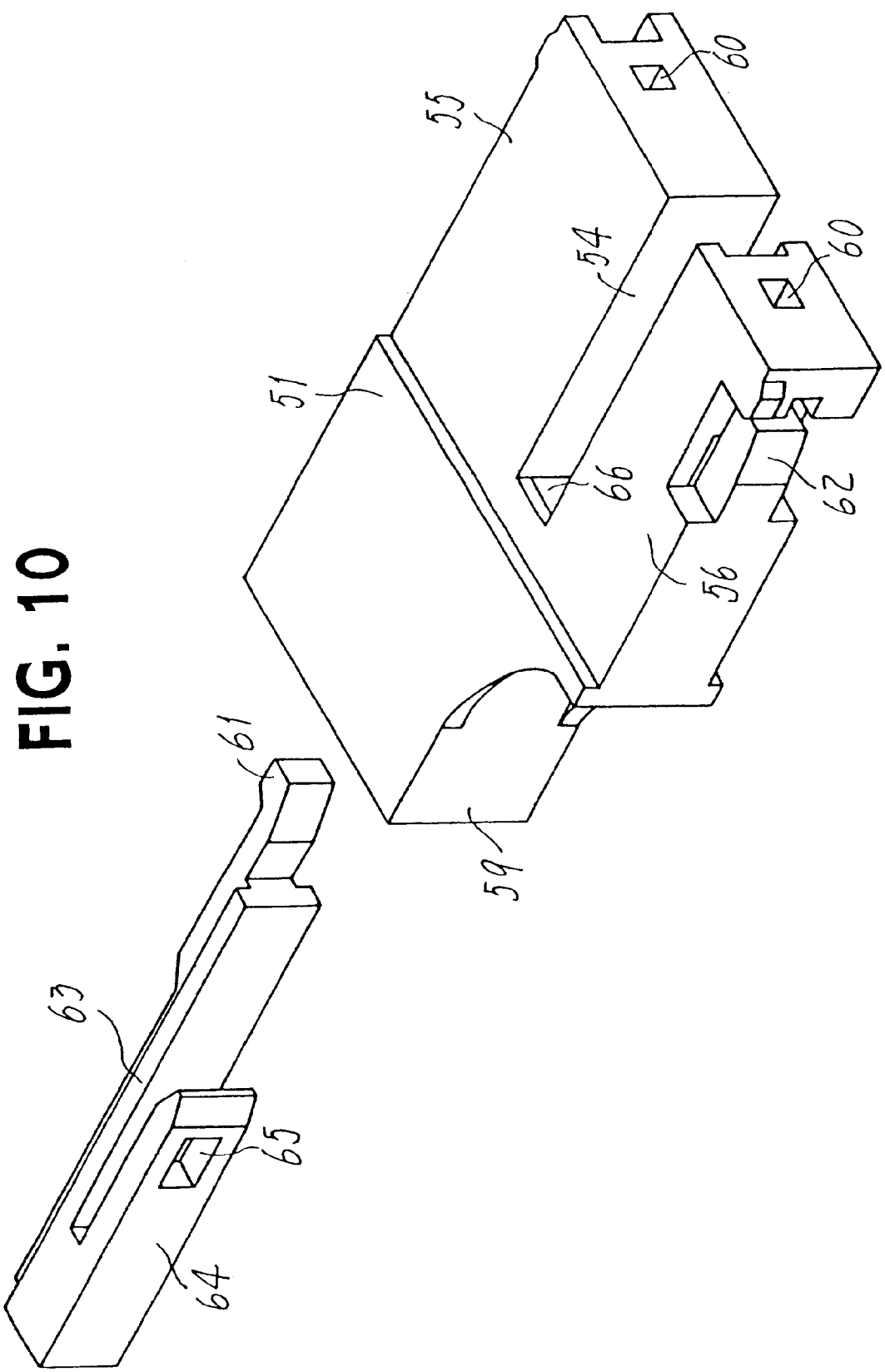
FIG. 10 is a perspective view of an insulated housing constituting the socket connector.

FIGS. 9 and 10 show a socket connector 50 designed herein to mate with the base connector 30 and electrically connect two wires 47 and 48 to the respective pin contacts 32 and 33.

The socket connector 50 comprises an insulated housing 51 that will be fitted in the insulated housing 31 of the base connector 30 through the opening 31 thereof. The socket connector further comprises two socket contacts 52 and 53 separated in the housing 51 and crimped on naked ends of the wires 47 and 48.

The insulated housing 51 has a front half generally of a depressed and rectangularly-parallelipiped shape in outer configuration, and is bifurcated due to a pair of rectangularly-cylindrical chambers 55 and 56 separated from each other by a cutout 54. These chambers have interiors or cavities 55 and 56 to accommodate the socket contacts 57 and 58. One of the socket contacts 52 that is crimped on the wire 47 connected to the input pin contact 32 is held in one of those chambers 55, wherein the latter is made so longer than the other 56 that sufficient linear and spatial distances are afforded to improve high-voltage resisting property. A hollow rear half 59 unites the chambers 55 and 56 to be integral with each other. Apertures 60 formed in front walls of the chambers 55 and 56 are for insertion of the outer ends 32*a* and 33*a* of the pin contacts 32 and 33. Lances 61 and 62 are disposed along the side walls of the chambers 55 and 56 so as to force the socket contacts 52 and 53 to lie on one sides thereof. One of the lances 61 is made not integral with the insulated housing 51, due to convenience in molding same. In detail, a support 63 that will be inserted into the cavity 57 through the rear opening thereof and along an inner side wall of the chamber 55 has an inner end serving as the lance 61. The support 63 also has an outer portion that is bent outwards to provide a latch 64. This latch 64 will advance through an aperture 66 of the hollow half 59 until a hole 65 engages a lug 67 protruding from an inner wall of the aperture 66, when the lance 61 is set in place in the housing 31 together with the support 63.

On the other hand, each of the socket contacts 52 and 53 consists of a crimpable portion 68 and a socket portion 69. The former portion will be crimped on the wire 47 or 48, with the latter portion fitting on the outer end 32*a* or 33*a* of the pin contact. In order to reduce overall size and thickness of the socket connector 50, the socket portions 69 are as shortened as possible and each socket contact 52 and 53 is disposed to lie on one of its sides. Since a long lance cannot be formed on such a shortened socket portion 69, just a short tongue 70 is formed there to engage with the lance 61 or 62 of the housing.

Due to this structure, the socket connector 50 will provide sufficient linear and spatial distances between the socket contacts 52 and 53, thereby not only improving high-voltage resisting property, but also miniaturizing and rendering thinner the connector.

Figure 11:
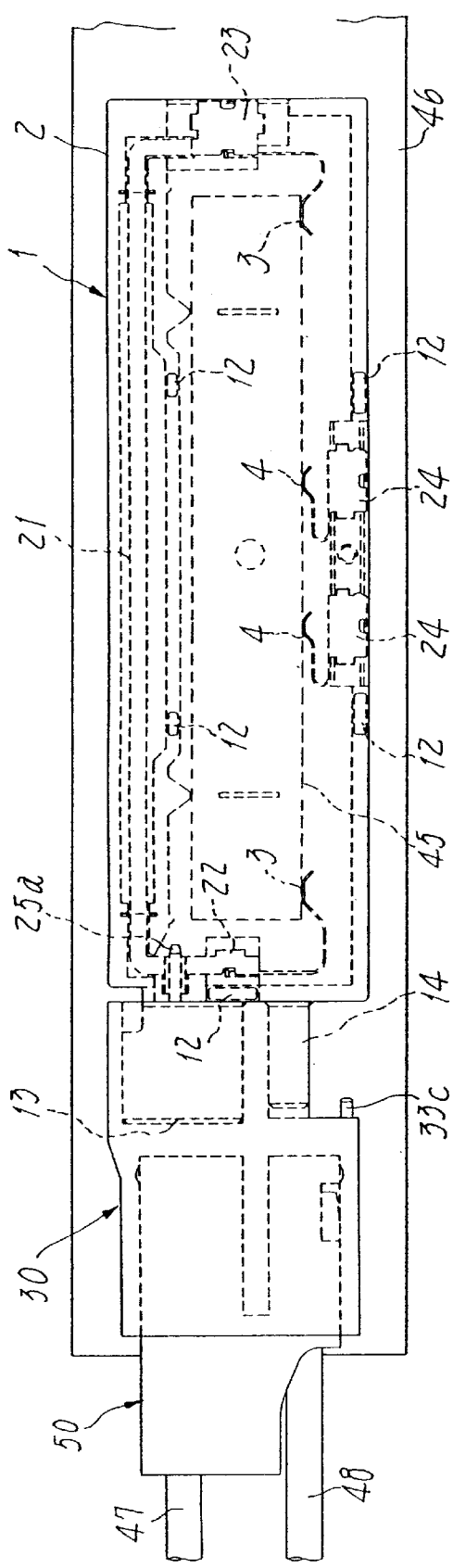
FIG. 11 is a plan view of a back-light inverter portion that is built for a liquid crystal panel and comprises the piezoelectric transformer-accommodating case of the invention and the base and socket connectors that connect the wires to the case.
Figure 12:
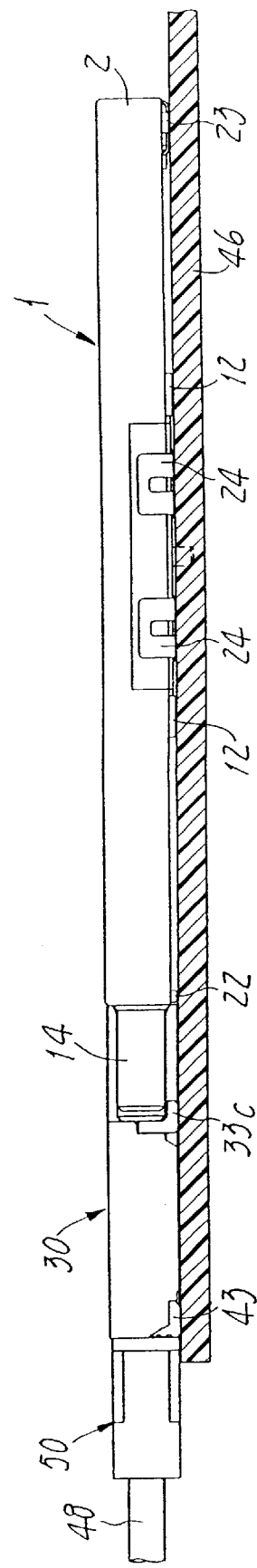
FIG. 12 is a side elevation of the inverter portion, partly shown in vertical cross section.

FIGS. 11 and 12 illustrate the piezoelectric transformer-accommodating case 1 coupled with the base connector 30 and the socket connector 50 and constituting an exemplary inverter power supply circuit for the back-light for a liquid crystal panel. The circuit board 46 is of an elongate rectangular shape having a width slightly larger than the case 1. The piezoelectric transformer 45 held in this case 1 has input electrodes 45*a* disposed fore and aft at opposite longitudinal ends of the case and conductively connected to the respective input terminals 3. Output electrodes 45*b* of the transformer are disposed at a middle region thereof intermediate the input electrodes and similarly connected to the respective input terminals 4.

The body 2 of that case 1 thus holding therein the transformer 45 will be turned upside down at first so that its opening is closed with the circuit board 46 to which the case is to be surface mounted. Then, the solderable portion 23 for one of the input terminals 3 as well as the solderable portions 24 for the output terminals 4 will be soldered to the circuit pattern (not shown). The support lugs 12 protruding from the case body 2 will thus bear against the circuit board 46, thereby leaving a clearance between same and said body. Sufficient linear and spatial distances are ensured in this manner between the input terminals 3 and the output terminals 4, affording a high-voltage resisting property.

The base connector 30 for connecting the wires to the case will then have its recess 40 and groove 41 engaged with the engagement protrusion 13 and the guide protrusion 14 of the case 1, when attached to one of the longitudinal ends thereof. The conductive post 25 inserted through engagement protrusion 13 will penetrate the back wall 35 through its aperture 42 to thereby provide the input pin contact 32. The output pin contact 33 will be soldered at its portion 33*c* to the circuit board 46 so as to electrically communicate with the output terminals 4, through the circuit pattern of said board. Also, the reinforcement metal pieces 43 will be soldered to the circuit board 46, to fixedly secure the base connector 30 thereto.

On the other hand, the socket connector 50 has the socket contacts 52 and 53 placed therein and fixed on the respective wires 47 and 48, the latter being in turn connected to respective terminals (not shown) of the liquid crystal panel's back-light. The rectangularly-cylindrical chambers 55 and 56 of the socket connector's insulated housing 51 will be put in the opening 34 of the base connector's insulated housing 31. As a result, the outer ends 32*a* and 33*a* of the pin contact 32 and 33 of the base connector 30 will respectively enter the chambers 55 and 56 through the apertures 60, thus being brought into contact and connection with the socket portions 69 of the those contacts 52 and 53. Consequently, the two wires 47 and 48 will come into electric connection with the piezoelectric transformer 45 via the socket connector 50, base connector 30 and case 1 which holds said transformer.

The power supply circuit for the inverter of the back-light is constructed in the manner described above has such a feature that sufficient linear and spatial distances are provided between the input terminals 3 and the output terminals 4 of the case 1, between the pin contacts 32 and 33 of the base connector 30, and also between the socket contacts 52 and 53 of the socket connector 50. Thanks to this feature, a high voltage which is supplied to the back-light device through the power circuit would not cause any troubles such as a short circuit accident. Further, all the case 1, base connector 30 and socket connector 50 are so small-sized and thin that the power circuit for the inverter can also be miniaturized and thinned.

In summary, the case provided and specialized herein to accommodate the piezoelectric transformer matches the recent smaller-sized and thinned back-light inverter circuit employing said transformer for the liquid crystal display, and also improve high-voltage resisting property by virtue of such increased linear and spatial distances.

A power supply circuit composed of such a case combined with the base connector defined in the accompanying claims 2 and 3, which in turn is coupled with the socket connector of the claims 4 and 5, will be useful to further render smaller and thinner the power circuit and further improve the voltage resisting property.

What is claimed is:

1. A piezoelectric transformer-accommodating case made of an insulating material to be of a flat and rectangular box-like shape and having two input terminals and two output terminals that are for connection with two input electrodes and two output electrodes of the piezoelectric transformer, respectively, the two input terminals being disposed respectively at opposite end walls of the case and arranged fore and aft longitudinally thereof, the case having an opening defined between the opposite end walls and elongate lateral walls, and comprising:

a lead electrically communicating with the two input terminals and held in a groove that is longitudinally formed in the case and along one of the lateral walls thereof, the lead being isolated within the groove so as not to be in contact with wall surfaces thereof,
a plurality of support lugs formed integral with a rim surrounding the opening,
the support lugs being shaped to bear against a circuit board in a manner so that the case is spaced upwards a distance from the circuit board so as to leave a clearance between said case and said board, and
an adapter secured to one of the opposite end walls of the case so as to mate with a base connector for connecting two wires to the case.

2. A base connector for connecting two wires to a piezoelectric transformer-accommodating case made of an insulating material to be of a flat and rectangular box-like shape and having two input terminals and two output terminals that are for connection with two input electrodes and two output electrodes of the piezoelectric transformer, respectively, the two input terminals being disposed respectively at opposite end walls of the case and arranged fore and aft longitudinally thereof, the case having an opening defined between the opposite end walls and elongate lateral walls, and comprising a lead electrically communicating with the two input terminals and held in a groove that is longitudinally formed in the case and along one of the lateral walls thereof, the lead being isolated within the groove so as not to be in contact with wall surfaces thereof, a plurality of support lugs formed integral with a rim surrounding the opening, the support lugs being shaped to bear against a circuit board in a manner so that the case is spaced upwards a distance from the circuit board so as to leave a clearance between said case and said board, and an adapter secured to one of the opposite end walls of the case so as to mate with a base connector for connecting two wires to the case, the base connector comprising:

an insulated housing,
an input pin contact and an output pin contact that are arranged in parallel with each other in the insulated housing, and
the pin contacts being respectively disposed in part in discrete compartments that are separated one from another with a partition formed in the insulated housing,
wherein the input pin contact is for electric connection with the input terminal, with the output pin contact being for electric connection with the output terminal.

3. A base connector defined in claim 2, wherein the input pin contact is capable of being inserted through one of the opposite end walls as so as to electrically communicate with the input terminal, and wherein the output pin contact has a rearwardly extending lead that is bent sideways and outwards to be soldered to the circuit board so that a circuit pattern thereon brings the output terminal into an electric communication with the output pin contact.

4. A socket connector to be coupled with a base connector for connecting two wires to a piezoelectric transformer-accommodating case, the piezoelectric transformer-accommodating case being made of an insulating material to be of a flat and rectangular box-like shape and having two input terminals and two output terminals that are for connection with two input electrodes and two output electrodes of the piezoelectric transformer, respectively, the two input terminals being disposed respectively at opposite end walls of the case and arranged fore and aft longitudinally thereof, the case having an opening defined between the opposite end walls and elongate lateral walls, and comprising a lead electrically communicating with the two input terminals and held in a groove that is longitudinally formed in the case and along one of the lateral walls thereof, the lead being isolated within the groove so as not to be in contact with wall surfaces thereof, a plurality of support lugs formed integral with a rim surrounding the opening, the support lugs being shaped to bear against a circuit board in a manner so that the case is spaced upwards a distance from the circuit board so as to leave a clearance between said case and said board, and an adapter secured to one of the opposite end walls of the case so as to mate with a base connector for connecting two wires to the case, and the base connector comprising an insulated housing, an input pin contact and an output pin contact that are arranged in parallel with each other in the insulated housing, and the pin contacts being respectively disposed in part in discrete compartments that are separated one from another with a partition formed in the insulated housing, wherein the input pin contact is for electric connection with the input terminal, with the output pin contact being for electric connection with the output terminal, wherein the socket connector brings the two wires into an electric communication with the respective pin contacts, the socket connector comprising:
a bifurcated and insulated housing,
a pair of rectangularly-cylindrical chambers constituting the bifurcated and insulated housing, and
socket contacts securing therein ends of the wires and lying in respective cylindrical chamber in such a state that said socket contact isolated from each other,
wherein one of the socket contacts is designed to mate with the input pin contact, and one of the cylindrical chamber accommodating the one socket contact is made longer than the other cylindrical chamber in which the other socket contact is secured, thereby affording between the socket contacts linear and spatial distances increased enough to enhance high-voltage resisting property of the socket connector.

5. A socket connector as defined in claim 4, further comprising lances for latching the socket contacts and causing each of them to lie on its side, wherein one of the lances is inserted in one of the cylindrical chambers along one side wall thereof, with the other lance being formed integral with one side wall of the other cylindrical chamber.

* * * * *